United States Patent
Provenziani

(10) Patent No.: US 10,224,263 B2
(45) Date of Patent: Mar. 5, 2019

(54) HEAT EXCHANGER

(71) Applicant: Provides Metalmeccanica S.R.L., Latina (LT) (IT)

(72) Inventor: Franco Provenziani, Latina (IT)

(73) Assignee: PROVIDES METALMECCANICA S.R.L., Latina (LT) (IT)

( * ) Notice: Subject to any disclaimer, the term of this patent is extended or adjusted under 35 U.S.C. 154(b) by 61 days.

(21) Appl. No.: 15/036,324

(22) PCT Filed: Jan. 22, 2014

(86) PCT No.: PCT/IB2014/058462
§ 371 (c)(1),
(2) Date: May 12, 2016

(87) PCT Pub. No.: WO2015/110865
PCT Pub. Date: Jul. 30, 2015

(65) Prior Publication Data
US 2016/0293516 A1    Oct. 6, 2016

(51) Int. Cl.
*F28F 3/02* (2006.01)
*H01L 23/427* (2006.01)
(Continued)

(52) U.S. Cl.
CPC ............ *H01L 23/427* (2013.01); *F28D 9/005* (2013.01); *F28D 9/0075* (2013.01); *F28F 3/02* (2013.01);
(Continued)

(58) Field of Classification Search
CPC .. F28F 3/02; F28F 3/048; F28D 9/005; F28D 2021/0028; F28D 9/0075
See application file for complete search history.

(56) References Cited

U.S. PATENT DOCUMENTS 3,155,565 A * 11/1964 Goodman ............... B01D 1/221
159/13.1
4,403,652 A *  9/1983 Schiltz ................. F28D 9/0081
165/167
(Continued)

FOREIGN PATENT DOCUMENTS

DE         19945978      *  8/2001
DE     102007002492 A1    9/2008
(Continued)

OTHER PUBLICATIONS

International Search Report and Written Opinion for International Application No. PCT/IB2014/058462 (dated Sep. 10, 2014) (9 pages).

*Primary Examiner* — Eric Ruppert
(74) *Attorney, Agent, or Firm* — Lucas & Mercanti, LLP

(57) ABSTRACT

A thermal exchange device with reduced sizes and suitable to cool down electronic components in data center is disclosed. The device includes:
  a pair of outer plates integral thereto, equipped with respective inlet doors and outlet doors for a cooling fluid and for a fluid to be cooled down, respectively; and
  an intermediate plate, interposed between the outer plates and integral thereto, which intermediate plate bears respective thermal exchange surfaces faced to the outer plates and equipped with fins suitable to increase the area of thermal exchange with the fluids,
wherein the whole configuration is so that between each outer plate and the respective exchange surface a passage compartment for the respective fluid remain defined,
which thermal exchange device is made integral, at an outer plate, with the casing of the electronic component to be cooled down.

16 Claims, 13 Drawing Sheets

(51) Int. Cl.
  *F28D 9/00* (2006.01)
  *H01L 23/473* (2006.01)
  *H01L 21/48* (2006.01)
  *F28F 3/04* (2006.01)
  *F28F 9/02* (2006.01)
  *F28D 21/00* (2006.01)

(52) U.S. Cl.
  CPC .............. *F28F 3/048* (2013.01); *F28F 9/026* (2013.01); *H01L 21/4882* (2013.01); *H01L 23/473* (2013.01); *F28D 2021/0028* (2013.01); *F28D 2021/0029* (2013.01); *F28F 2260/02* (2013.01); *F28F 2275/06* (2013.01); *H01L 2924/0002* (2013.01)

(56) References Cited

U.S. PATENT DOCUMENTS

| | | | |
|---|---|---|---|
| 2003/0047303 A1* | 3/2003 | Andersson | F28D 9/005 165/167 |
| 2005/0247433 A1* | 11/2005 | Corrado | G06F 1/20 165/80.4 |
| 2008/0314559 A1 | 12/2008 | Hsu et al. | |
| 2012/0097366 A1 | 4/2012 | Chen et al. | |
| 2012/0103579 A1* | 5/2012 | Reif | F28D 9/005 165/167 |
| 2012/0211211 A1 | 8/2012 | Shih | |

FOREIGN PATENT DOCUMENTS

| | | | | |
|---|---|---|---|---|
| EP | 1394491 A2 | 3/2004 | | |
| JP | 09292193 A | * 11/1997 | ........... | F28D 9/0075 |

* cited by examiner

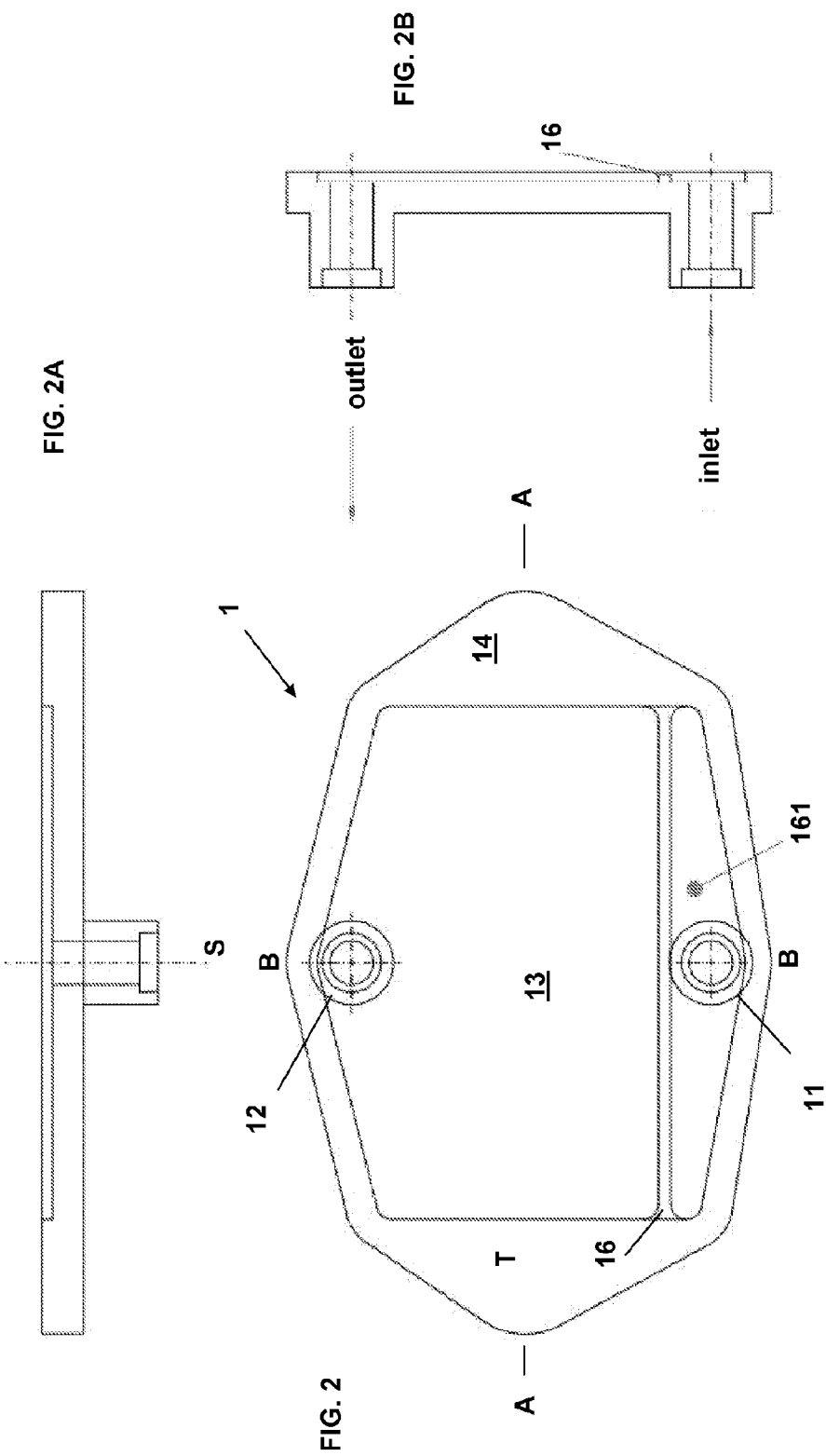

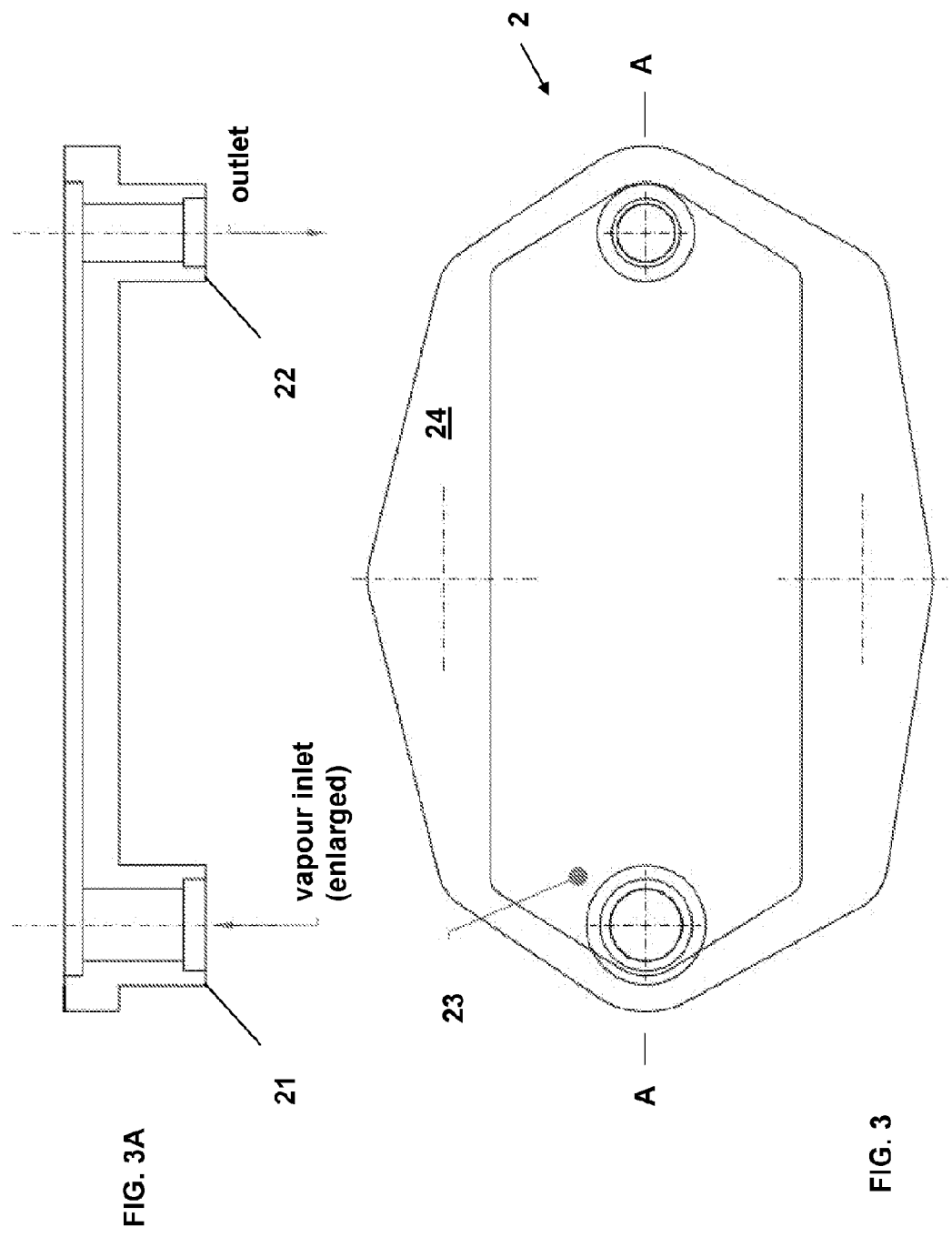

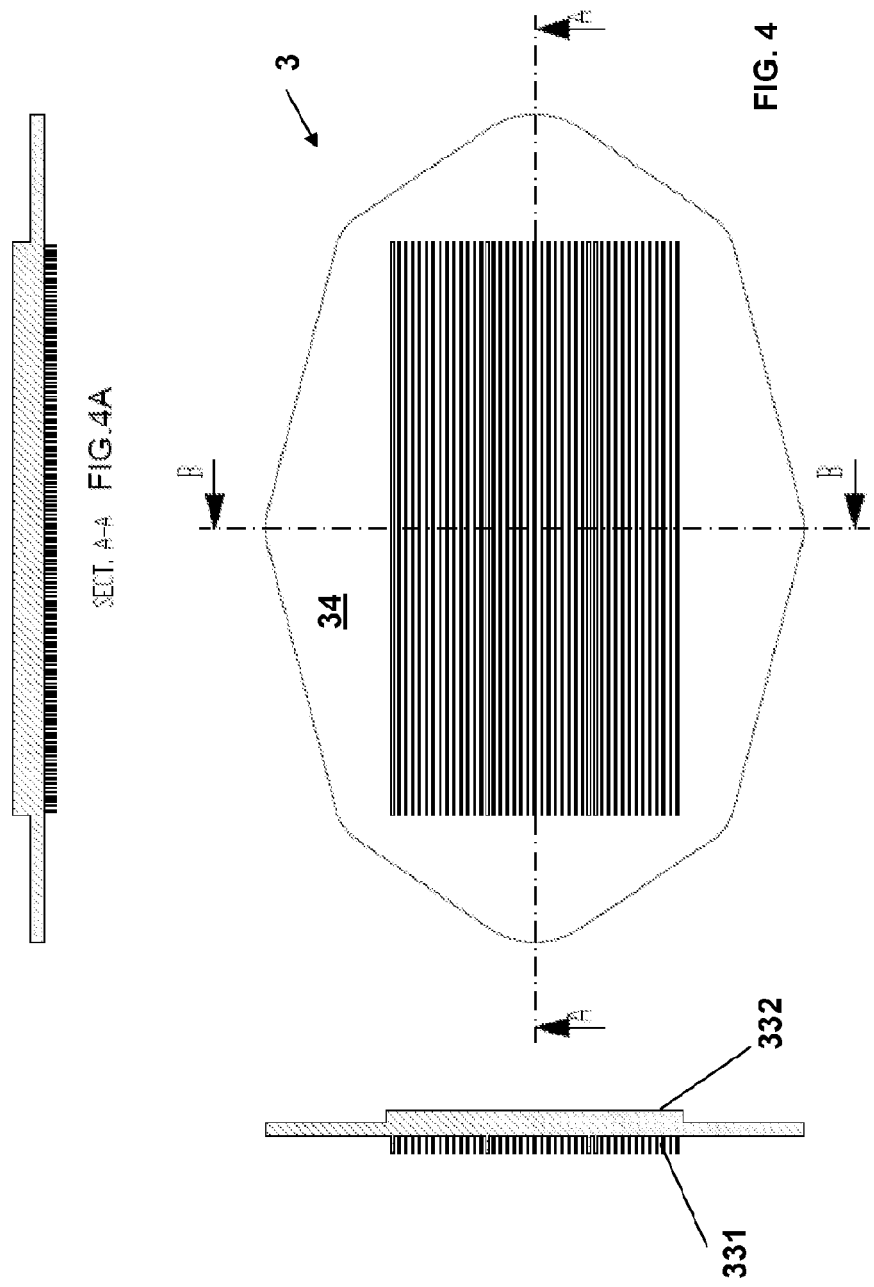

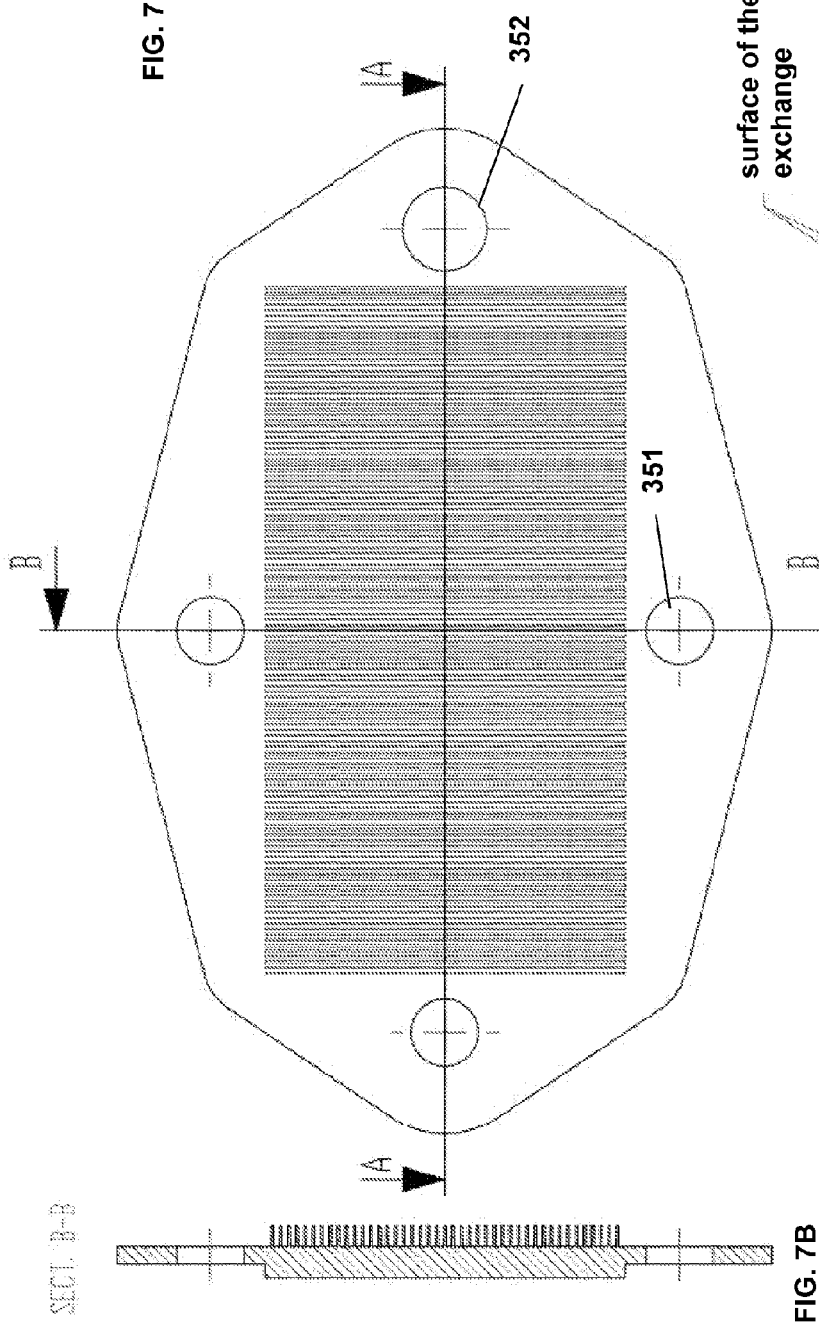

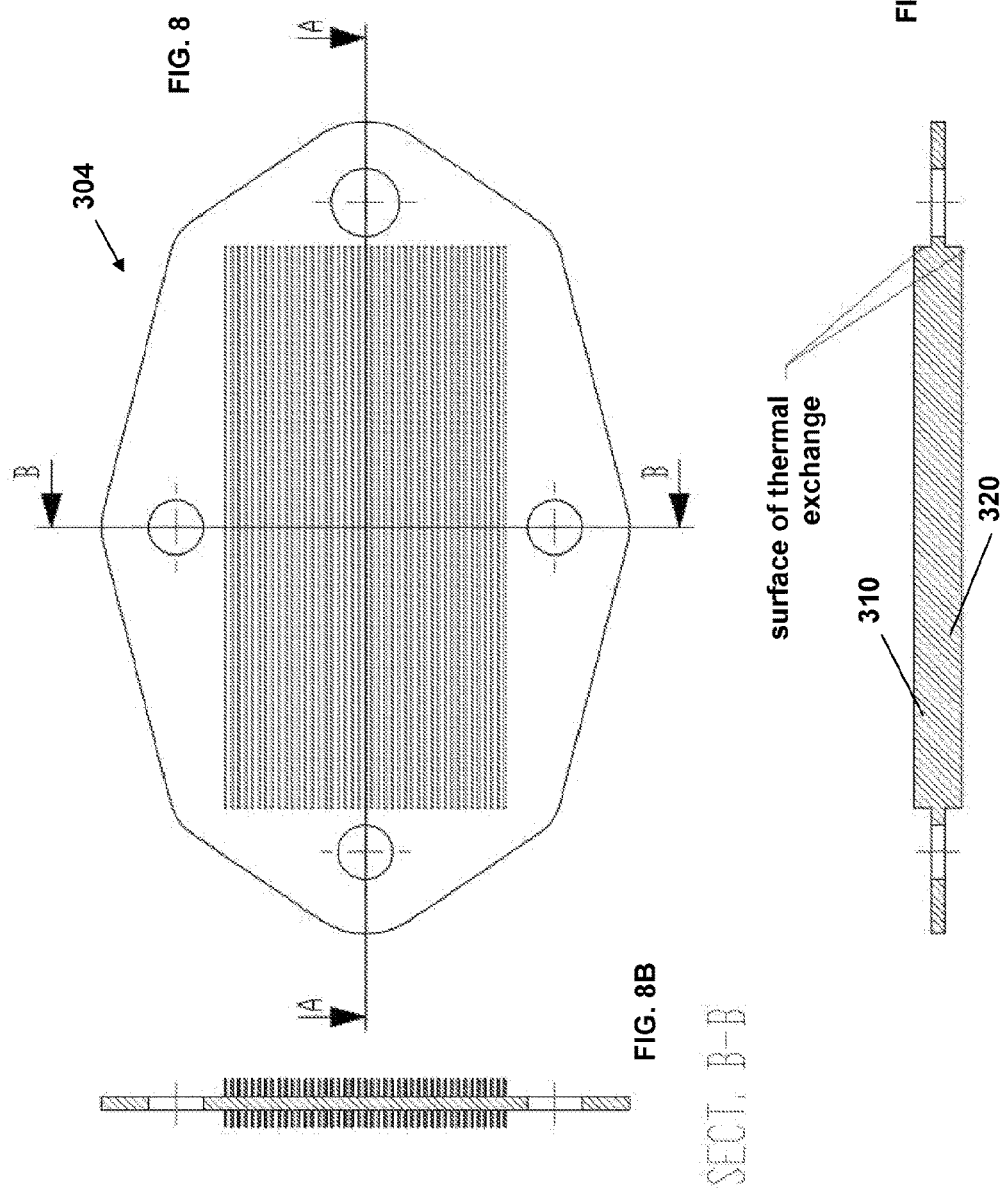

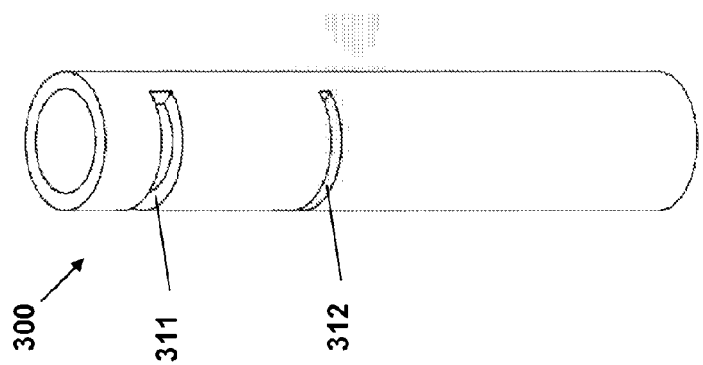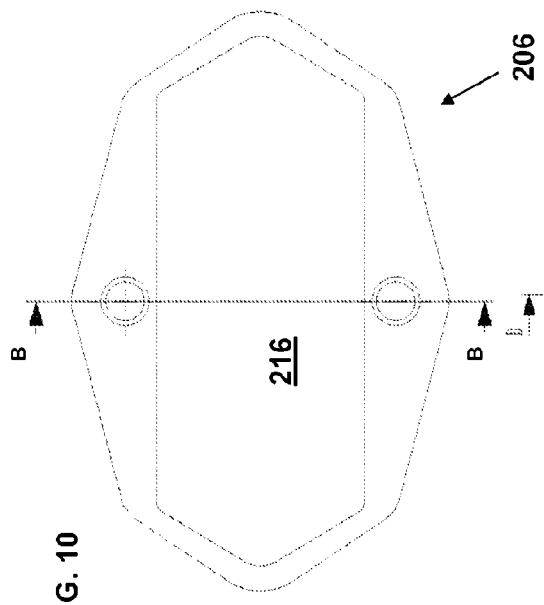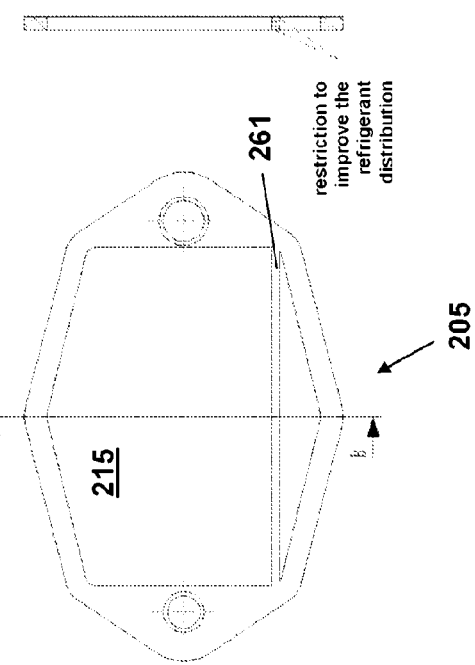

HEAT EXCHANGER

CROSS-REFERENCE TO RELATED APPLICATIONS

This application is a 371 of PCT/IB2014/058462, filed Jan. 22, 2014.

TECHNICAL FIELD OF THE INVENTION

The present invention relates to a heat exchanger, in particular to an extremely compact exchanger and with reduced sizes suitable to be used for cooling down in situ electronic components or in other applications wherein extremely reduced overall dimensions of the cooling system are required.

BACKGROUND

One of the most important problems linked to the development of the technologies and computer services is to cool down the electronic components. In particular, in case of the known remote "data centres" managing, for example, the services of "cloud" kind, so-called "close control systems" are used, that is cooling systems substantially under the form of huge cabinets housing thermal exchange components. Such systems are physically arranged alternated with systems for storing data.

However, the just-described cooling solution involves big overall dimensions. Furthermore, the spaces dedicated to said cooling systems, in reality, are taken away from the theoretical capacity destined to the data-managing systems.

It is also to be noted that the mentioned cooling systems, in general, manage the temperature of the air in the environment, and not directly the one of the electronic components needing cooling. Therefore, devices for sucking and cooling air are however necessary, arranged outside the environments housing the data-managing systems and the associated cooling apparatuses.

For cooling microcontrollers or chips even miniaturised heat exchangers were developed, for example the so-called "cold plates" mentioned in US 2001/0079376. Such exchangers can be made integral with the chip casing at its own casing, inside thereof a cooling fluid circulates. However, this system needs a second thermal exchange stage, out of the miniaturised exchanger, to decrease the temperature of the cooling fluid. Such second thermal exchange stage, however, involves big overall dimensions comparable to those of the above-mentioned "close control systems".

In general terms, the known systems are not sufficiently compact, nor they result to be modular with respect to the application to electronic apparatuses of different type or to subsequent upgradings of a same electronic apparatus.

SUMMARY OF THE INVENTION

The technical problem placed and solved by the present invention is then to provide a thermal exchange device allowing obviating the drawbacks mentioned above with reference to the known art.

Such problem is solved by a device according to claim 1 and by an associated thermal exchange method.

Preferred features of the present invention are object of the depending claims.

The invention provides indeed a thermal exchange device with extremely reduced overall dimensions. In one base embodiment thereof, such device comprises a pair o covering outer plates acting as casing therebetweeen an intermediate plate is housed, according to a sandwich-like arrangement of the intermediate plate between two covering plates. The intermediate plate bears two thermal exchange faces with increased surface, typically by means of fins indeed arranged bilaterally on both faces of the intermediate plate. Each one of such faces is faced on a respective outer plate. In such way, within the device a cooling fluid and a fluid to be cooled down can be fed, in order to obtain a thermal exchange stage with double fluid within the same casing.

As said above, the intermediate plate bears thermal exchange members, in particular bilateral fins, preferably integral with the plate.

Advantageously, such thermal exchange members form flow channels defined between the intermediate plate and each one of the covering plates. Preferably, each channel has a high ratio between height and width ("aspect ratio").

In a more articulated embodiment, between two covering outer plates a plurality of intermediate plates is arranged, in case separated by spacer members. Preferably, between pairs of adjacent intermediate plates—or between an intermediate plate and an adjacent covering plate—the above-mentioned flow channels are defined, in particular between the respective thermal exchange tongues.

In case of embodiment with coupling of more intermediate plates, the cooling fluid and/or the fluid to be cooled down can be distributed parallelly to different flow channels, and in particular between different pairs of adjacent plates, for example by means of using tubes/distributing members properly holed at each (group of) flow channels.

In case of applications wherein very low values of load losses of fluids upon crossing the thermal exchange channels (for example in case of fluids in natural circulation), the embodiment with several intermediate plates allows creating flow channels with big section—and therefore with low load losses—without penalizing excessively the thermal exchange efficiency.

In a preferred operation mode, the cooling fluid vaporizes at least partially after the thermal exchange, that is the device has an "evaporation side". In such case a stabilization of the two-phase flow (vapour-liquid) can be imposed and a return flow ("backflow") can be avoided by means of a micro-orifice or a decrease in section, obtained at the fluid inlet.

The flow of the cooling fluid and/or the fluid to be cooled down can be controlled (even) by distributing means existing on one or more plates or on spacer members, in particular under the form of projections or reductions thereof.

Other advantages, features and use modes of the present invention will result evident from the following detailed description of some embodiments, shown by by way of example and not with limitative purpose.

BRIEF DESCRIPTION OF THE FIGURES

Reference to the figures of the enclosed drawings will be made, wherein:

FIGS. 2, 2A e 2B refer to a first outer plate composing the device of FIG. 1, by showing a front view thereof of the portion inside the device itself, a view in cross section performed according to the line A-A of FIG. 2 and a view in longitudinal section performed according to the line B-B of FIG. 2, respectively;

FIGS. 3 e 3A refer to a second outer plate composing the device of FIG. 1, by showing a front view thereof of the inner portion of the device itself and a view in cross section performed according to the line A-A of FIG. 3, respectively;

FIGS. 4, 4A e 4B refer to an intermediate plate composing the device of FIG. 1, by showing a front view thereof, a view in cross section performed according to the line A-A of FIG. 4 and a view in longitudinal section performed according to the line B-B of FIG. 4, respectively;

FIGS. 7, 7A and 7B refer to the intermediate plate composing the device of FIG. 5, by showing a front view thereof, a view in cross section performed according to the line A-A of FIG. 7 and a view in longitudinal section performed according to the line B-B of FIG. 7, respectively;

FIGS. 8, 8A and 8B refer to an embodiment variant of the intermediate plate of FIG. 7, by showing a front view thereof, a view in cross section performed according to the line A-A of FIG. 8 and a view in longitudinal section performed according to the line B-B of FIG. 8, respectively;

FIGS. 9 and 9B refer to a first type of spacer member composing the device of FIG. 5, by showing a front view thereof and a view in longitudinal section performed according to the line B-B of FIG. 9, respectively;

FIGS. 10 and 10B refer to a second type of spacer member composing the device of FIG. 5, by showing a front view thereof and a view in longitudinal section performed according to the line B-B of FIG. 10, respectively; and FIG. 11 shows a perspective view of a tube or distributing duct composing the device of FIG. 5.

The thicknesses, the shapes and the curvatures represented in the above-shown figures are to be meant by way of example only and they are not necessarily shown in scale and/or in proportion.

DETAILED DESCRIPTION OF PREFERRED EMBODIMENTS

Figure 1:
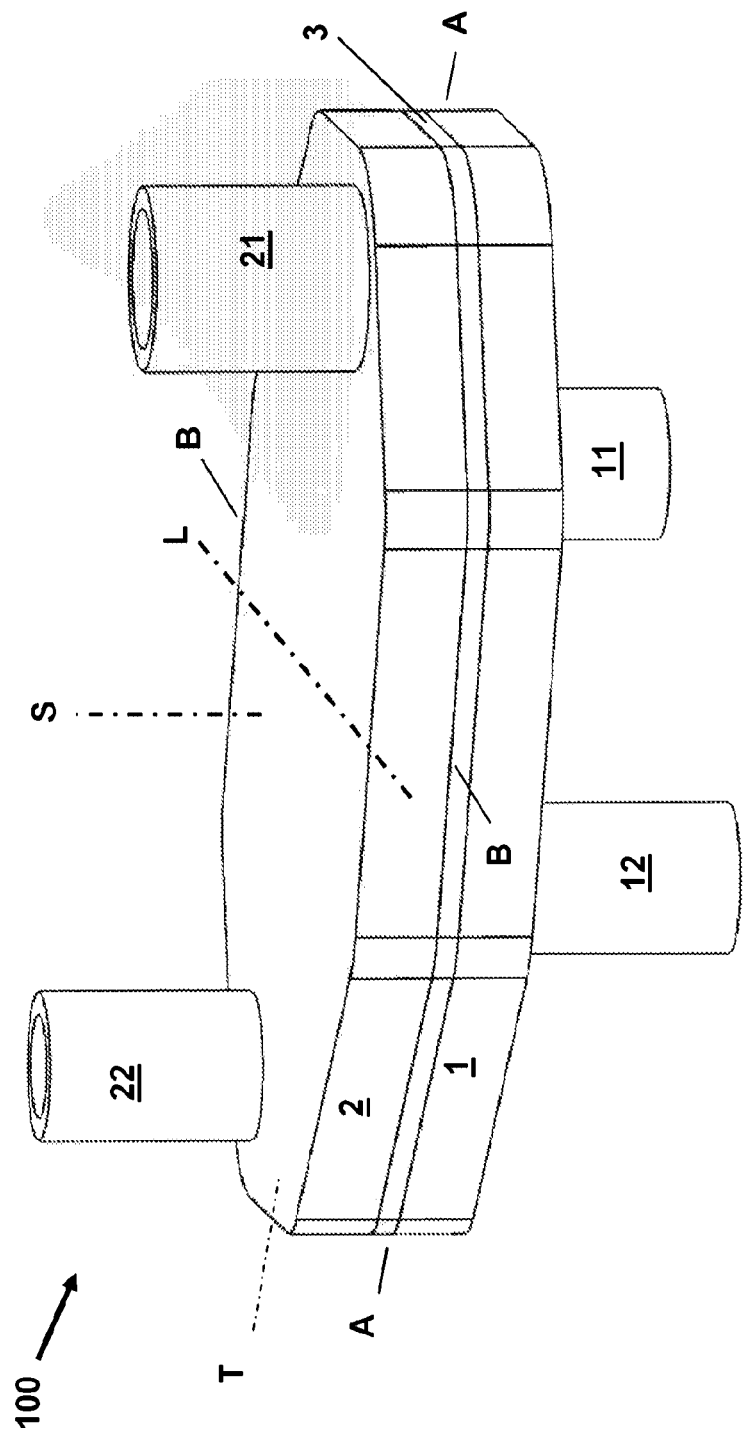
FIGS. 1, 1A and 1B relate to a first preferred embodiment of a thermal exchange device according to the present invention, by showing it in an assembled configuration respectively in perspective and according to a cross and longitudinal section performed according to the lines A-A and B-B of FIG. 1.
Figure 1A:
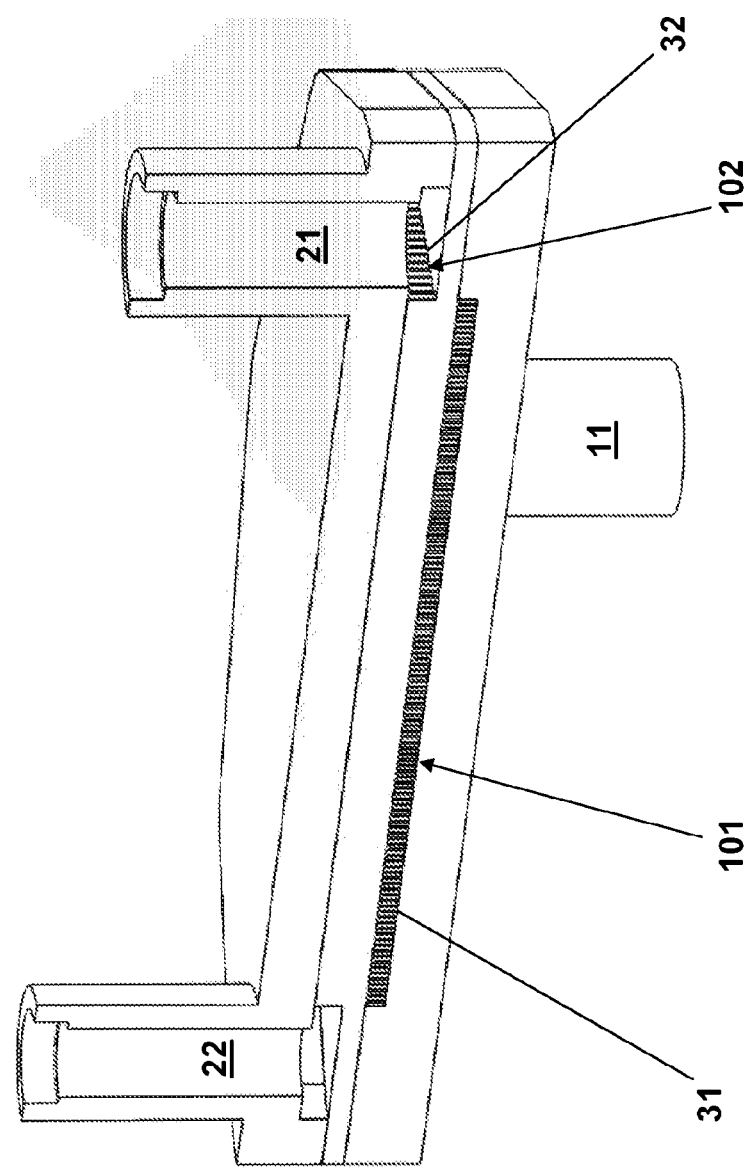
Figure 1B:
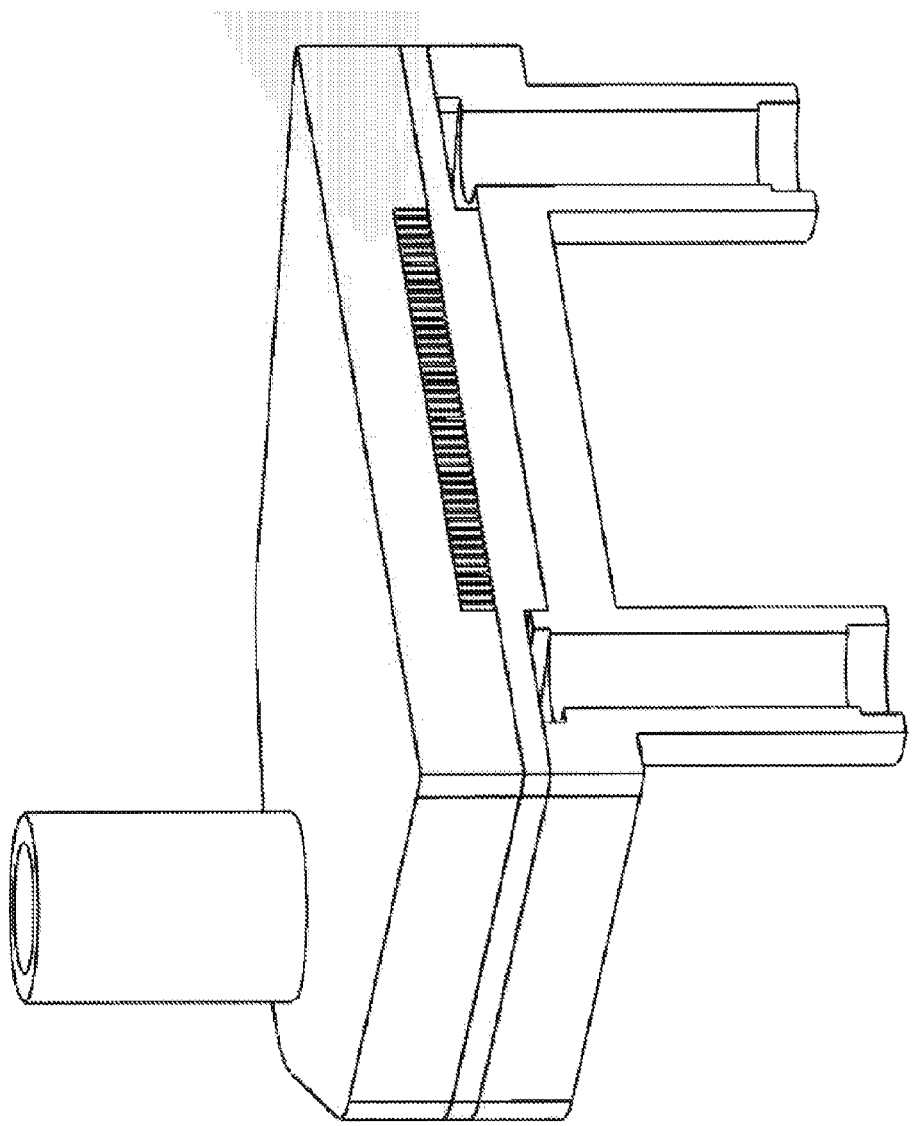

By firstly referring to FIGS. 1, 1A and 1B, a thermal exchange device according to a first preferred embodiment of the invention is designated as a whole with 100. The device 100 is suitable for cooling down electronic components, in particular servers and data-managing systems, in general. In even more general terms, the device 100 is particularly suitable for any application wherein an extreme compactness of the cooling system is required or advantageous.

The device 100 mainly comprises a first and a second outer—or covering—plate designated with 1 and 2, respectively, and made integral or integrated one with the other one. The two plates 1 and 2 define a casing of the device itself. Such casing, in particular at the second outer plate 2, is suitable to be fastened to a component to be cooled down, for example to a casing thereof. Such component to be cooled down can be directly an electronic component or a so-called "cold plate" associated to the electronic component itself.

Between the two plates 1 and 2 an intermediate plate 3 is received, preferably made fixed to the two outer plates 1 and 2.

As just illustrated, in the present embodiment the device of the invention provides two outer bodies designated as plates as having a flat configuration with a longitudinal direction, designated with L, and a cross direction, designated with T, prevailing with respect to the thickness, the latter detected by a direction S. Embodiment variants can provide that one or both outer plates 1 and 2 are replaced by one or more bodies shaped not necessarily with flat conformation.

As just said, then, to the plates 1, 2 and 3, and to the device 100 in general, a longitudinal direction L and a cross direction T can be associated, the latter corresponding, in the present example, to a prevailing extension direction. In the present embodiment, along the above-mentioned directions L and T symmetry axes, or substantial symmetry, are defined for the geometry of each plate 1, 2 and 3 and of the whole device 100.

As it can be better seen in FIGS. 2, 2A e 2B, the first outer plate 1 bears a first inlet door 11 for a cooling fluid (or refrigerant) and a first outlet door 12 for outletting such fluid downwards, as it will be illustrated in details hereinafter, of the thermal exchange.

In the present embodiment, the above-mentioned first doors 11 and 12 are arranged substantially centred according to the axis L. Such doors 11 and 12 preferably are defined by sleeve, ducts or nozzles extending towards outside the plate 1 in direction S and suitable to be connected to a circuit for feeding the above-mentioned cooling fluid. Preferably, the doors 11 and 12 have circular geometry.

The first plate 1 comprises a portion of peripheral edge 14 thereat it is made fixed to the other two plates 2 and 3. The peripheral edge 14, and the plate 1 as a whole in general, has a substantially polygonal shape, preferably with rounded corners. In the present example, such shape is substantially hexagonal. Of course, for the plate 1—as well as for the other two plates 2 and 3—different shapes, even circular shapes, are possible.

Inside the device 100, the plate 1 has a receding or lowered surface or central face 13, circumscribed by the edge portion 14. At such lowered surface 13 the two doors 11 and 12 open.

Near the inlet door 11, the first plate 1, at the receding surface 13, has distributing means. In the present example, such distributing means comprises a distributing septum 16, under the shape of cross member projecting towards the inside of device 100 (in direction S) with respect to the surface 13. The distributing means further comprises a distributing portion 161 of the surface 13 circumscribing the inlet door 11 and preferably with triangular profile with rounded corners. The distributing surface 161 is defined peripherally by the septum 16 and by the edge 14. In more general terms, the distributing surface 161 can provide a flared or tapered development, with area growing from the inlet door 11 towards the septum 16.

The distributing means, indeed, performs the function of distributing the cooling fluid entering the device 100 at the first inlet plate 11 within a first thermal exchange compartment, and in particular within related thermal exchange channels which will be defined hereinafter.

Embodiment variants can provide the use of distributing members even in other positions and/or on other plates.

As it can be better seen in FIGS. 3 and 3A, even the second outer plate 2 bears a (second) inlet door 21, in this case for a fluid to be cooled down (or hot fluid) and a (second) outlet door 22 for outletting such fluid downwards the thermal exchange, as it will be illustrated in details hereinafter.

In the present embodiment, the above-mentioned second doors 21 an 22 are arranged substantially centred according to the axis T. Even the doors 21 and 22 preferably are defined by sleeves, ducts or nozzles extending outside in direction S and suitable to be connected to a circuit for feeding the above-mentioned fluid to be cooled down. Preferably, the doors 21 and 22 have circular geometry.

Still based upon a preferred embodiment, the inlet door 21 has greater sizes, and in particular diameter, than the second door 22, for the reasons which will be explained hereinafter.

Similarly to the first plate 1, even the second outer plate 2 has a portion of peripheral edge 24 thereat it is made fixed to the other two plates 1 and 3. The peripheral edge 24, and the plate 2 as a whole in general, has the same shape of the first plate 1, being valid then the same description of the latter.

The edge 24 circumscribes a receding or lowered surface or central face 23, similarly to what illustrated for the first plate 1. At the surface 24 the two doors 21 and 22 open.

Preferably, at the respective edge 14, 24 each one of the two plates 1 and 2 has a bevelled profile. The configuration is so that between such bevels a seat remains defined, preferably substantially shaped like a "V", to receive a welding (with or without filler material).

As it can be better seen in FIGS. 4, 4A e 4B, even the intermediate plate 3 has a polygonal whole shape, similarly to what described with reference to the plates 1 and 2, so as to be housed between the latter. Furthermore, even the intermediate plate 3 has a peripheral edge 34. Within the latter a first and a second thermal exchange surface, respectively 331 and 332, are defined, surrounded by said edge 34 and corresponding to opposite faces of the plate 3. In particular, the first exchange surface 331 is arranged faced to the surface 13 of the first outer plate 1, so as to define together with the latter the above-mentioned first thermal exchange compartment within the cooling fluid flows. Similarly, the second exchange surface 332 is arranged faced to the surface 23 of the second outer plate 2, so as to define together with the latter a second thermal exchange compartment within the fluid to be cooled down flows.

Each thermal exchange surface 331, 332 has respective (first or second) exchange members suitable to increase the area of thermal exchange respectively with said cooling fluid and with said fluid to be cooled down. In the present embodiment, such members can be under the shape of fins, preferably projecting in direction S towards the respective outer plate 1 or 2, and they are designated with 31 and 32, respectively, in FIG. 1A. Such members project from a base of the respective surface 331, 332 and they insert in the compartment of the first or the second outer plate 1 or 2, respectively, defined at the respective receding surface 13 or 23.

Embodiment variants can provide a different implementation or shape of the exchange members, for example under the form of straight or shaped pins.

In the present embodiment, the thermal exchange members 31 and 32 are arranged so as to form the above-mentioned flow channels (or microchannels) for the respective cooling fluid or fluid to be cooled down. Such channels are designated with 101 and 102, respectively, in FIG. 1A. The channels 101, 102 address the respective fluid from the respective first or second inlet door 11, 21 to the respective first or second outlet door 12, 22.

Preferably, the thermal exchange members 31 and 32 abut directly onto the surfaces 13 and 23 of the two outer plates 1 and 2. In such way, between the members 31, 32 and the respective plates 1, 2 closed flow channels remain defined.

In the present example, the configuration is so that such channels, for each face of the intermediate plate 3, are parallel the ones to the others and with a substantially rectilinear development, respectively in longitudinal direction (L) with respect to the plates for the channels 101 and in cross direction (T) with respect to the plates for the channels 102.

Upon use, then, between the first plate 1 and the first exchange surface 331 of the intermediate plate 3, that is in the first exchange compartment and specifically in the channels 101 thereof, the cooling fluid flow for the first inlet plate 11 to the first outlet plate 12. At the same time, between the second plate 2 and the second exchange surface 332 of the intermediate plate 3, that is in the second exchange compartment and specifically in the channels 102 thereof, the fluid to be cooled down flows from the second inlet door 21 to the second outlet door 22.

The fluid to be cooled down can come from a "cold plate"—or other cooling device—directly associated to an electronic component. Alternatively, the device 100 can be made directly fixed to the electronic component, and in particular to the casing thereof, for example at its own second outer plate 2.

The cooling fluid can be selected in a group comprising several refrigerants, for example water, R134a refrigerant or any other fluid. The same can be said for the fluid to be cooled down.

In the present example, the above-described arrangement of the inlet and outlet doors determines a flow of the two fluids according to substantially mutually orthogonal directions. In particular, in the present embodiment the flow channels 101 formed by the first members 31 are substantially orthogonal to the flow channels 102 formed by the second members 32, coherently with the above-described arrangement of the respective inlet and outlet doors.

Of course, different configurations are possible. For example, embodiment variants can provide a configuration of the device 100 determining a flow in equicurrent or in counter-current of said fluids.

Still in the present embodiment, a preferred application provides that the cooling fluid enters in the liquid or bi-phase state and that it can go out at least partially in the gaseous form.

Furthermore, in the present example it is provided that the fluid to be cooled down enters in the gaseous form and goes out in the liquid state and for this reason the inlet door 21 preferably provides a larger inlet area than the area of the outlet door 22.

By considering such preferred application, the first plate 1 can be defined "evaporating side" and the second plate 2 "condensing side".

In the applicative configuration wherein the fluid to be cooled down comes from a circuit skimming the electronic component(s) and then flows to the device 100, such fluid can be indeed in the gaseous state. In this case, the fluid circulation can be indeed fed by the same just mentioned state exchange, without needing a circulation pump on the "condensing side".

On the side of the cooling fluid, instead, a cooler ("chiller") outside the same device and based, for example, upon the use of an additional refrigerating fluid can be provided.

Embodiment variants can provide a so-called "two-or-more step" exchange configuration, wherein one or both above-mentioned fluids indeed perform various passages within the respective exchange compartment before outgoing from the respective outlet door. To this purpose, within such compartments dividing septa can be provided.

Furthermore, a plurality of devices such as the one described above can be assembled in a thermal exchange system, wherein said devices preferably are in communication of cooling fluid the one to the other one, according to an arrangement of in-series or in-parallel connection.

In an alternative embodiment, between two outer—or covering—plates as those described above several intermediate plates with bilateral fins can be housed, which plates are indeed arranged the ones parallel to the others in a sandwich-like configuration between the two outer plates. With such intermediate plates stacked one onto the other one, the sets of thermal exchange members, or fins, of faced plates create the above-mentioned (micro)channels between the two plates. The above-mentioned channels preferably are closed by the surfaces of the plates and/or of the fins thereof. Such configuration with multiple intermediate plates stacked between two covering outer plates can avoid the need of connection by means of welding or soldering at least in the (inner) thermal exchange area between adjacent plates.

FIGS. 6 to 11 relate indeed to an embodiment providing a plurality of intermediate plates. Such additional embodiment will be now described only with reference to the aspects differentiating it from the first embodiment illustrated sofar. In particular, apart from where differently specified or shown for the covering outer plates and for each one of the intermediate plates, the same considerations already made above with reference to the plates 1, 2 and 3 are valid.

Figure 5:
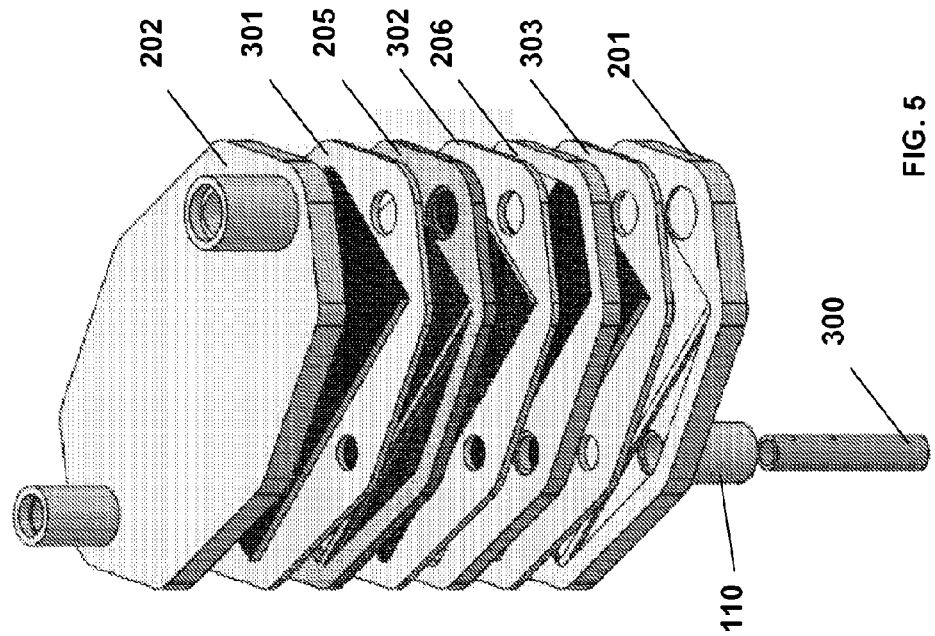
FIGS. 5 and 6 refer to a second preferred embodiment of the thermal exchange device according to the present invention, by showing an exploded perspective view thereof and a perspective view in assembled configuration, respectively.
Figure 6:
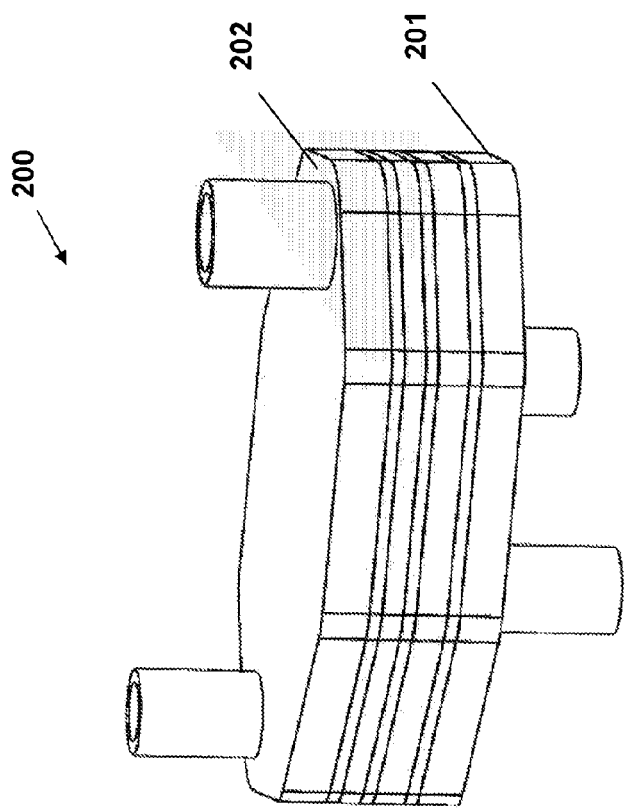

As shown in FIGS. 5 and 6, the device of this second embodiment, designated with 200, has indeed two covering outer plates, here designated with 201 and 202, therebetween three intermediate plates, 301, 302 e 303, respectively, are interposed. Between each pair of intermediate plates a spacer member, or plate, is interposed. In particular, between the first intermediate plate 301 and the second intermediate plate 302 a first spacer member 205 is interposed and between the second intermediate plate 302 and the third intermediate plate 303 a second spacer member 206 is interposed.

Figure 5A:
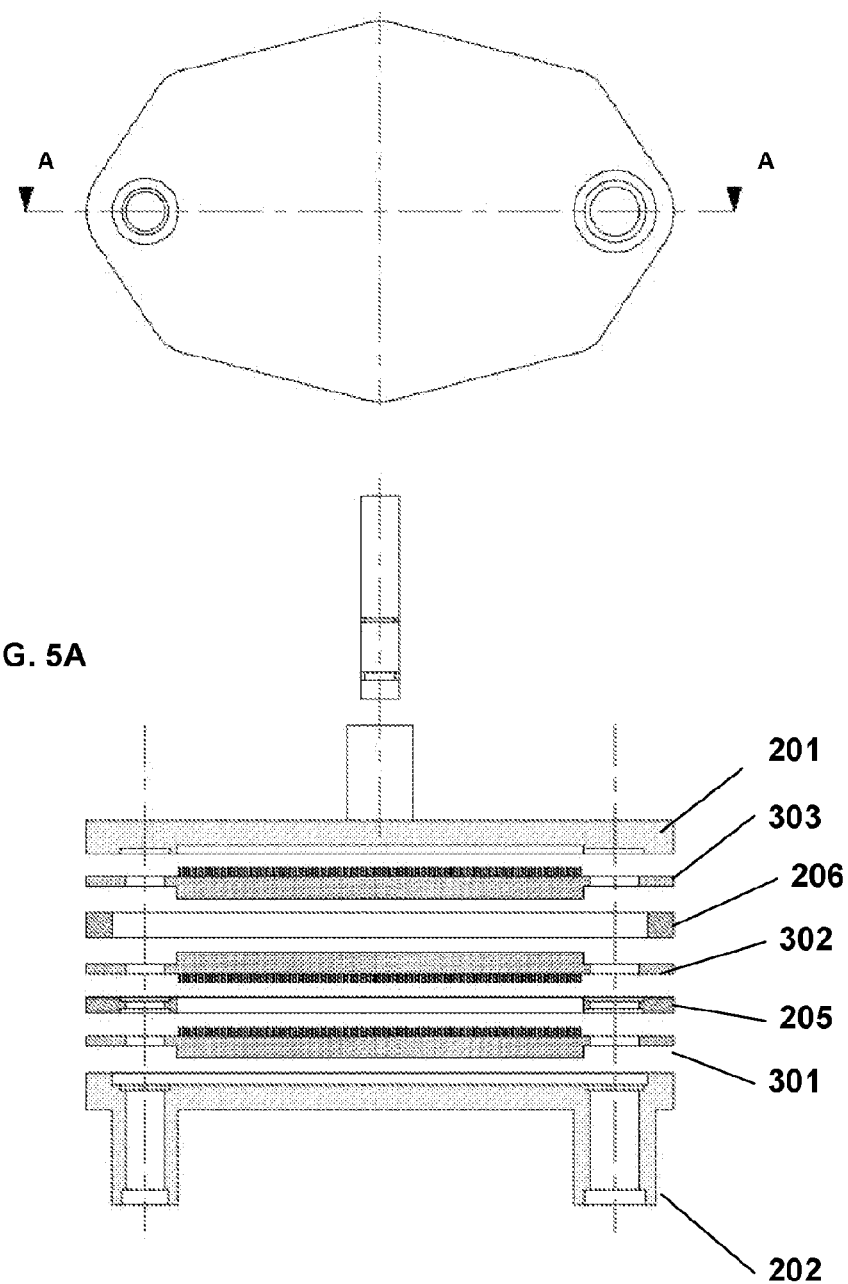
FIGS. 5A and 5B show each one a top plan view of the device of FIG. 5 together with a cross section according to the line A-A and a longitudinal section according to the line B-B, respectively.
Figure 5B:
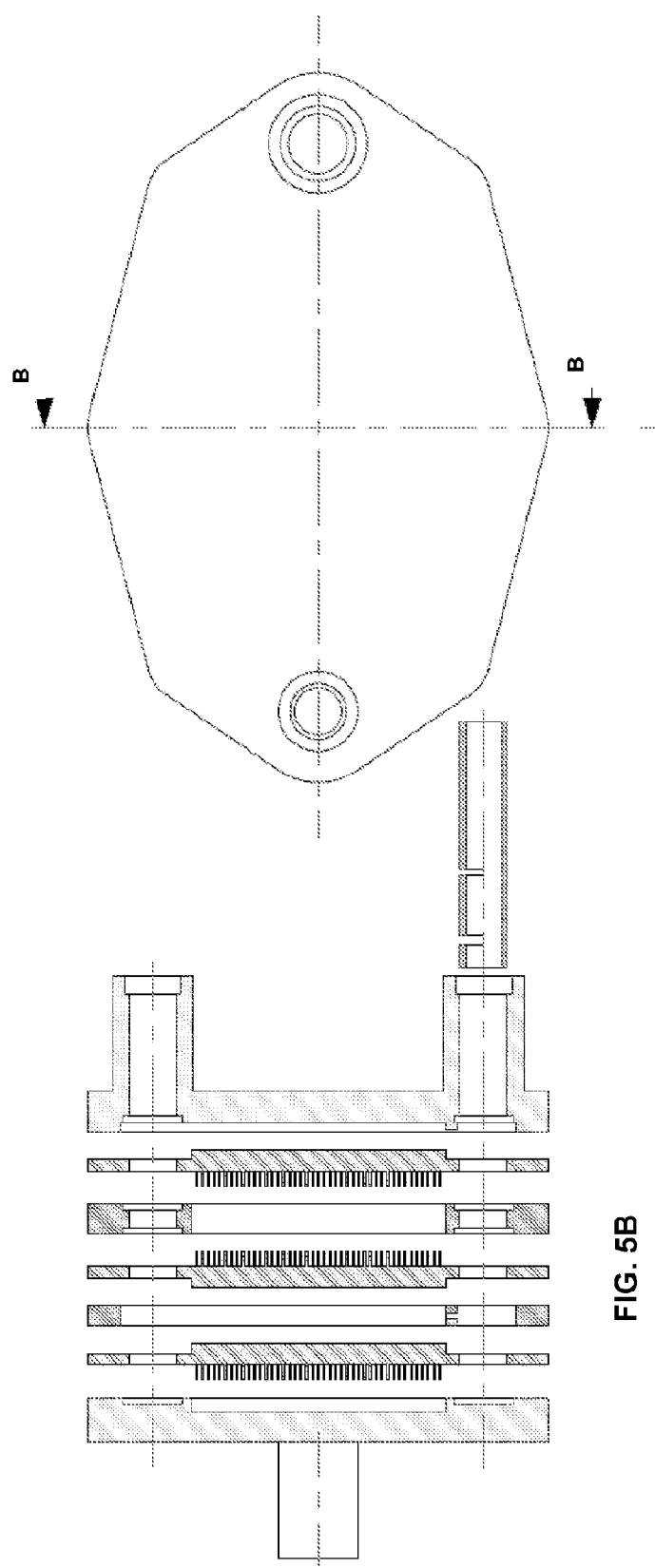
Figure 6A:
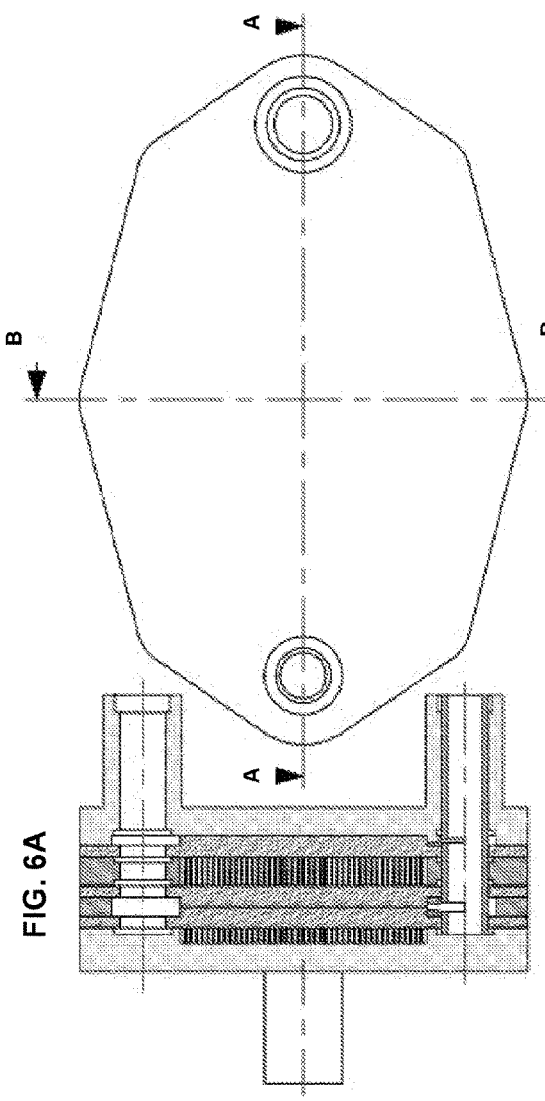
FIGS. 6A and 6B show a top plan view of the device of FIG. 6 together with a cross section according to the line A-A and a longitudinal section according to the line B-B, respectively.
Figure 6B:
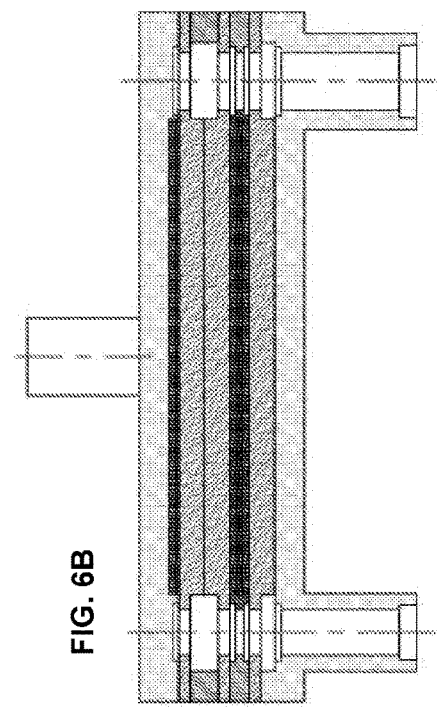

The specific structure and arrangement of the plates is better visible in FIGS. 5A and 5B in exploded configuration and in FIGS. 6A and 6B in assembled configuration. The specific structure of an intermediate plate is shown in FIGS. 7, 7A and 7B.

As shown in the figures, and in particular in the just mentioned FIGS. 7, 7A and 7B, each intermediate plate has bilateral fins, wherein the group of fins on a face extends in orthogonal direction with respect to the fins of the group on the opposite face, as for the above-described first embodiment.

Still as shown in the figures—in particular in FIGS. 6A and 6B and similarly to the above-described first embodiment—the thermal exchange fins of the face of the first intermediate plate 301 faced on the second covering plate 202 and the fins of the third intermediate plate 303 faced on the first covering plate 201 insert in the lowered surfaces thereof, by defining substantially rectilinear flow channels. The fins of each intermediate plate face on another intermediate plate define, too, substantially rectangular channels, with the faced edges of the fins abutting the ones onto the others. Therefore, the configuration is so that the fins on the faces of two intermediate plates faced one onto the other one extend in the same direction and preferably with the same pitch, so as to define said channels. In the present example, such channels defined between faced intermediate plates have greater, in particular substantially double, height (in direction S), than the one of the channels defined between one intermediate plate and a corresponding covering plate.

Even in this case, embodiment variants can provide a different arrangement of the fins. For example, FIGS. 8, 8A and 8B show an example of intermediate plate, designated with 304, equipped with substantially rectilinear bilateral fins 310 and 320 extending, and they are apt to define channels, in the same direction for the two faces of the plate itself.

The particular combination wherein several intermediate plates having equal bilateral fins (that is with analogous fins for direction and preferably sizes on both sides of the plate) are coupled together can allow increasing considerably the passage section of one of the two fluids with respect to the other one. In this way, the load losses of the fluid crossing the channels with greater sections decrease considerably, even if a thermal exchange with high efficiency is obtained. Such combination is very advantageous in the applications wherein one of the fluids moves under conditions of natural circulation, applications wherein, in order to obtain the required maximum flow values to dispose correctly the design thermal power, it is necessary having very low fluid load losses.

Such particular combination of plates can be used even in the side-fluid implementation of a device of "cold plate" type.

FIGS. 9, 9B and 10, 10B show the first and the second spacer member 205 and 206, respectively. Both such members have a through seat, 215 and 216, respectively, reproducing the shape of the surface of the intermediate plates involved by the fins. Furthermore, the first member 205, at such surface, has a distributing septum 261. Of course, embodiment variants can provide different distributing means.

As shown in FIG. 5, in the present embodiment it is provided that at the first covering plate 201, within the relative inlet door herein designated with 110, a distributing duct 300 of the refrigerating fluid inserts. Such duct 300 indeed is suitable to a fluid distribution among the corresponding channels defined between the several plates. To this purpose, the intermediate plates bear suitable through seats for such duct. By way of example, such seat is designated with 351 for the intermediate plate shown in FIG. 7. Of course, the refrigerant is distributed in groups of alternated channels, in the herein considered example between the first outer plate 201 and the third intermediate plate 303 and between the second intermediate plate 302 and the first intermediate plate 301. In the other channels, that is those between the third intermediate plate 303 and the second intermediate plate 302 and between the first intermediate plate 301 and the second outer plate 202 the fluid to be cooled down is instead supplied. To this purpose, the plates bear a second seat for such supply of fluid to be cooled down. By way of example, such seat is designated with 352 for the intermediate plate shown in FIG. 7. The supply of the fluid to be cooled down can take place in natural way, by convection, or by means of a forced supply system. The supply of the cooling fluid within the duct 300 takes place by means of suitable forced supply means. The supply of the cooling fluid could take place even in natural way, by convection. The supply of the fluid to be cooled down, in case of forced supply, can take place by means of a duct similar to the duct 300.

The distributing duct 300 is shown in perspective in FIG. 11. Thereon two slots or holes, in the present example elongated holes, are better visible, therethrough the above-mentioned channels are fed. In particular, a first slot 311 arranges at the channels between the first covering plate 201 and the third intermediate plate 303 and a second slot 312 arranges at the channels between the second intermediate plate 302 and the first intermediate plate 301.

In general terms, in the here considered embodiment with several intermediate plates inside the device 200 a distribution of the fluid to be cooled down and of the refrigerating one according to an in-parallel thermal exchange configuration is provided. In particular, such two fluids are supplied in respective channels formed by the thermal exchange members, at alternated levels along the thickness of the device. The fluids are supplied and picked-up laterally, that is along the direction S of the device, from/towards the inlets and outlets of the two outer plates, according to an in-parallel supplying and picking-up arrangement.

The above-illustrated spacer members (also) are useful for implementing the mechanical seal of the device and the integrity (separation) of each circuit crossed by the corresponding fluid (in simple words, to guarantee that there is seal between the two circuits).

The spacer members can be welded to the plates adjacent thereto at the outer edge (for example, analogously to what made between the intermediate plate and the outer plates in the above-described device with single intermediate plate).

As said above, in the implementation with several intermediate plates, each intermediate plate has seats, in particular holes, at the distributing channels inletting and outletting the two fluids, whereas the spacer members can have holes only at the distributing channels inletting and outletting the fluid which does not cross the flow channels used for the thermal exchange housed in the corresponding portion of the spacer member.

In order to guarantee the above-mentioned mechanical seal and integrity of each circuit, the several plates could be welded the ones to the others, ion case by means of weldings obtained in suitable seats.

In and implementing variant, it is possible connecting integrally therebetween all the described components not by means of a welding process, but by means of coupling with bolts, seats with seals and o-rings, or equivalent mechanical means. In this way, an increasing modularity of the intermediate plates is obtained, that is additional intermediate plats can be added in second moment in order to satisfy a subsequent requirement of increasing the power to be disposed of.

The system of the invention, particularly in the above-mentioned case of several devices in series or in parallel and/or with several intermediate plates, can be used in combination with an outer frame improving the mechanical seal thereof.

As said above, the invention device, particularly in the above-illustrated embodiments, can be defined compact and it is suitable for an implementation in reduced sizes.

By way of example only, hereinafter an example is provided for sizing a (intermediate) plate with increased exchange surfaces (by means of fins or other thermal exchange members) with respect to the corresponding theoretical plane surfaces thereof for a device of the described type with reference to FIGS. 1 to 4B.

W=43 mm—size of the thermal exchange surface, in the present example a plane surface, 331, 332 of the intermediate plate 3 along the longitudinal axis L Y=83 mm—size of the thermal exchange plane surface 331, 332 of the intermediate plate 3 along the cross axis T $S_{theoretical}$=W×Y=43×83=3569 mm²—area of the theoretical thermal exchange plane surface Sizes of the first thermal exchange members 31, that is of the fins defining, in the present example, channels parallel to the cross axis T:

$H_{31}$=2.5 mm height in direction S $Tk_{31}$=0.28 mm size (thickness) in direction T $Gap_{31}$=0.7 mm gap between two adjacent fins (in direction T)

$$N_{fin31} = \text{rounding down of ratio } Y/(Tk_{31} + Gap_{31}) =$$
$$= \text{rounding down } .43/(0.28 + 0.7) = \text{rounding down } 43.88 =$$
$$= 43, \text{ that is indicative number of fins}$$

$$S_{eff31}=N_{fin31} \times Y \times 2 \times H_{31}+(Y \times W)=43 \times 83 \times 2 \times 2.5+(83 \times 43)=21414 \text{ mm}^2$$

Ratio $S_{eff31}/S_{theoretical}$=21414/3569=6

Sizes of the second thermal exchange members 32, that is of the fins defining, in the present example, channels parallel to the longitudinal axis L:

$H_{32}$=1.7 mm height in direction S $Tk_{32}$=0.22 mm size (thickness) in direction L $Gap_{32}$=0.44 mm gap between two adjacent fins (in direction L)

$$N_{fin32} = \text{rounding down of ratio } Y/(Tk_{32} + Gap_{32}) =$$
$$= \text{rounding down } 83/(0.22 + 0.44)$$
$$= \text{rounding down } 125.76 =$$
$$= 125, \text{ that is indicative number of fins}$$

$$S_{eff32}=N_{fin32} \times W \times 2 \times H_{32}+(Y \times W)=125 \times 43 \times 2 \times 1.7+(83 \times 43)=21844 \text{ mm}^2$$

Ratio $S_{eff32}/S_{theoretical}$=21844/3569=6.12

In an embodiment, the value of the Ratio $S_{eff}/S_{theoretical}$ can be considered comprised in a range of about 6-16, with the preferred value equal to 11.

Therefore, in an embodiment example the bilateral thermal exchange members of the intermediate plate are so as to determine an increase in the thermal exchange surface comprised in a range from 6 to 16 times, preferably equal to 11 times, with respect to the base plane surface.

The present invention has been sofar described with reference to preferred embodiments. It is to be meant that other embodiments may exist, belonging to the same inventive core, as defined by the protection scope of the herebelow reported claims.

The invention claimed is:

1. A compact heat exchange device adapted to cool electronic components, comprising:

a first outer plate, bearing a first inlet door for a cooling fluid and a first outlet door for the cooling fluid downstream of a thermal exchange;

a second outer plate, fixed with said first outer plate and bearing a second inlet door for a fluid to be cooled down and a second outlet door for the fluid to be cooled down downstream of the thermal exchange; and at least one intermediate plate interposed between said first and second outer plates and fixed with said first and second outer plates, each the at least one intermediate plate being arranged in parallel with respect to another of the at least one intermediate plate and/or to said first and second outer plate, wherein each of said at least one intermediate plate bears a first thermal exchange surface and a second thermal exchange surface arranged on opposite sides of the intermediate plate in such a way that each of said first and second thermal exchange surface faces said first or second outer plate or a corresponding first or second surface of another adjacent intermediate plate, wherein said first thermal exchange surface is equipped with a first exchange member and said second thermal exchange surface is equipped with a second exchange member, wherein said first and second exchange members, together with a corresponding surface facing them of said first or second outer plate or of an additional intermediate plate, respectively define flow channels for the cooling fluid flowing from said inlet door to said outlet door and for the fluid to be cooled down flowing from said second inlet door to said second outlet door, wherein one of said first outer plate, said second outer plate, and the at least one intermediate plate bears a fluid-distributing projecting cross-member septum arranged orthogonally with respect to one of said flow channels, said septum defining a single continuous slot with an opposing surface of another one of said first outer plate, said second outer plate, and the at least one intermediate plate, the slot extending an entire length of said septum and providing a passage for the cooling fluid entering said one of said flow channels, and said heat exchange device being adapted to be made fixed with, or in communication with, by the fluid to be cooled down, an electronic component.

2. The device according to claim 1, wherein the at least one intermediate plate is a single intermediate plate, said first outer plate and said first exchange surface define between them flow channels for the cooling fluid flowing from said first inlet door to said first outlet door, and said second outer plate and said second exchange surface define between them flow channels for the fluid to be cooled down flowing from said second inlet door to said second outlet door.

3. The device according to claim 1, which is adapted to be made fixed to a cooling device associated with the electronic component to be cooled down.

4. The device according to claim 1, which is configured to operate with an equicurrent or counter-current flow of said cooling fluid and fluid to be cooled down.

5. The device according to claim 1, wherein said first inlet and outlet doors and said second inlet and outlet doors and/or said flow channels are configured so that the respective flows of cooling fluid and fluid to be cooled down flow substantially in orthogonal directions.

6. The device according to claim 5, wherein said flow channels are substantially rectilinear.

7. The device according to claim 1, wherein said first and/or second thermal exchange members are configured so as to increase the thermal exchange surface 6 to 16 times with respect to the corresponding first or second heat exchange surface unprovided with said first and/or second thermal exchange members.

8. The device according to claim 1, wherein said first inlet door and first outlet door and/or said second inlet door and second outlet door have different sizes in order to take into account the different state of the cooling fluid and of the fluid to be cooled down entering and/or outletting the heat exchange device.

9. The device according to claim 1, wherein said first and second thermal exchange members are implemented integral with the respective intermediate plate.

10. The device according to claim 6, wherein said flow channels are closed, said exchange members being in abutment onto the surface of the related plate faced thereto or onto the extreme edges of thermal exchange members of said related plate.

11. The device according to claim 1, wherein said first and/or said second inlet door and/or said first and second outlet door are arranged substantially transversally or longitudinally centred on the respective first or second plate.

12. The device according to claim 1, wherein the at least one intermediate plate comprises a plurality of intermediate plates arranged stacked so as to define sets of flow channels arranged at different levels in the device.

13. The device according to claim 12, comprising a system for distributing the cooling fluid and/or the fluid to be cooled down, which distributing system is configured so that, one or each one of such fluids is supplied parallel to, and picked up parallel from, channels on different levels, according to an alternating distribution of the two fluids.

14. The device according to claim 13, comprising at least a spacer member interposed between adjacent intermediate plates.

15. A thermal exchange system, comprising a plurality of heat exchange devices, according to claim 1, wherein said devices are in fluid communication with each other by the cooling fluid and/or the fluid to be cooled down, according to an arrangement of in-series or in-parallel connection.

16. The device according to claim 7, wherein said first and/or second thermal exchange members are fins.

* * * * *